United States Patent [19]

Warmerdam

[11] Patent Number: 5,587,695
[45] Date of Patent: Dec. 24, 1996

[54] MEASURING TRANSFORMER FOR SOLID-STATE ELECTRICITY METERS

[75] Inventor: Petrus Warmerdam, Wetzikon, Switzerland

[73] Assignee: Zellweger Luwa AG, Switzerland

[21] Appl. No.: 287,004

[22] Filed: Aug. 8, 1994

Related U.S. Application Data

[63] Continuation of Ser. No. 988,313, Dec. 9, 1992, abandoned.

[30] Foreign Application Priority Data

Dec. 13, 1991 [CH] Switzerland .......................... 03672/91

[51] Int. Cl.$^6$ ..................................................... H01F 27/28
[52] U.S. Cl. ........................ 336/84 R; 336/192; 336/223; 336/195
[58] Field of Search .................................. 336/192, 84 R, 336/84 C, 84 M, 223, 220, 195

[56] References Cited

U.S. PATENT DOCUMENTS

| | | | |
|---|---|---|---|
| 1,308,448 | 7/1919 | Sandell | 336/223 X |
| 2,467,531 | 4/1949 | Lamphere | 336/84 R |
| 2,782,386 | 2/1957 | Cornell | 336/223 X |
| 2,908,866 | 10/1959 | Heiland et al. | 324/97 |
| 3,629,761 | 12/1971 | Lundgren | 336/223 X |
| 3,736,542 | 5/1973 | Ashe | 336/223 X |
| 3,792,396 | 2/1974 | Panu | 336/84 R X |
| 3,816,776 | 6/1974 | Chari | 336/84 R |
| 4,041,358 | 8/1977 | Donahue et al. | 361/365 |
| 4,810,989 | 3/1989 | Brandenberg et al. | 336/84 |
| 5,001,420 | 3/1991 | Germer | 324/142 |
| 5,128,611 | 7/1992 | Konrad | 324/142 |

FOREIGN PATENT DOCUMENTS

| | | | |
|---|---|---|---|
| 0082082 | 6/1983 | European Pat. Off. . | |
| 0262293 | 4/1988 | European Pat. Off. . | |
| 0494427 | 7/1992 | European Pat. Off. . | |
| 2257972 | 6/1974 | Germany . | |
| 211196 | 7/1984 | Germany | 336/195 |

*Primary Examiner*—Laura Thomas
*Attorney, Agent, or Firm*—Burns, Doane, Swecker & Mathis

[57] ABSTRACT

The present invention relates to a measuring transformer which contains a primary conductor which carries current to be measured, and a secondary coil which is magnetically coupled thereto. The primary conductor is shaped helically and forms a body, like a helical spring, which surrounds the secondary coil with at least one turn. The primary conductor is preferably formed by a tube having a spiral groove which passes through its wall. The primary conductor has inherent stability which is very high such that no special holding means are required for the secondary coil. The secondary coil is extremely easy to install in the primary conductor and there are no problems with installation tolerances and the like.

23 Claims, 2 Drawing Sheets

MEASURING TRANSFORMER FOR SOLID-STATE ELECTRICITY METERS

This application is a continuation of application Ser. No. 07/988,133, filed Dec. 9, 1992, now abandoned.

BACKGROUND AND FIELD OF INVENTION

The present invention relates to a measuring transformer for solid-state electricity meters, having a primary conductor which carries the current to be measured and having a secondary coil which is magnetically coupled thereto.

In a measuring transformer of this type, which is described in EP-A-262,293, the disclosure of which is hereby incorporated by reference in its entirety, the primary conductor is formed into a U-shaped bracket and, with its projection, engages around the secondary coil which has a cross-section matched to the U-shape of the current bracket. The secondary coil is arranged in a housing and, together with said housing, forms a structural unit. This is intended to permit simple installation of the secondary coil, which is not critical with respect to mechanical tolerances, between the legs of the current bracket forming the primary conductor.

It is now intended by means of the invention to specify a measuring transformer in which no special holder for the secondary coil is required and which nevertheless is simple to install and whose installation is not critical with respect to tolerances. In addition, the magnetic coupling between the primary conductor and the secondary coil is intended to be as optimum as possible.

SUMMARY AND OBJECTS OF THE INVENTION

This object is achieved according to the invention in that the primary conductor is of helical construction and forms a body in the manner of a helical spring, which surrounds the secondary coil with at least one turn.

A preferred exemplary embodiment of the measuring transformer according to the invention is characterized in that the body, which is formed by the primary conductor, is formed by a tube having a helical groove which passes through its wall.

As a result of the construction of the primary conductor according to the invention, the secondary coil is surrounded by the primary conductor over its complete circumference. In consequence, the distance between the complete outer surface of the secondary coil and the primary conductor is always of equal size, as a result of which an optimally homogeneous magnetic field and very good magnetic coupling are produced. In addition, the tubular primary conductor has an intrinsic stability which is so high that no additional holding means are required for the secondary coil. For installation, the secondary coil is simply inserted into the tube formed by the primary conductor, so that there are also no problems whatsoever with installation tolerances and the like.

BRIEF DESCRIPTION OF THE DRAWINGS

Other objects and advantages of the present invention will become more apparent from the following detailed description of preferred embodiments when read in conjunction with the accompanying drawings wherein like elements are designated by like reference numerals and wherein.

DETAILED DESCRIPTION OF PREFERRED EMBODIMENTS

Figure 1:
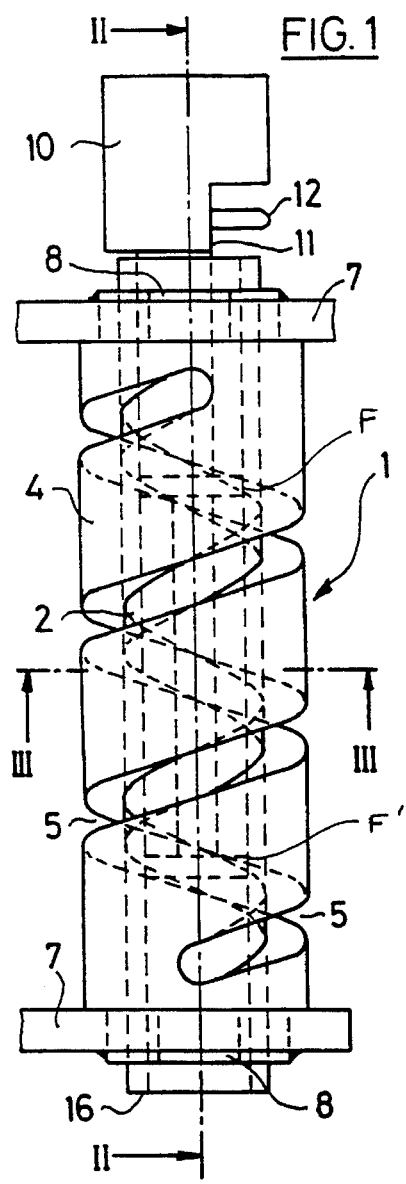
FIG. 1 shows a view of an exemplary measuring transformer according to the invention, with the magnetic screening removed.
Figure 2:
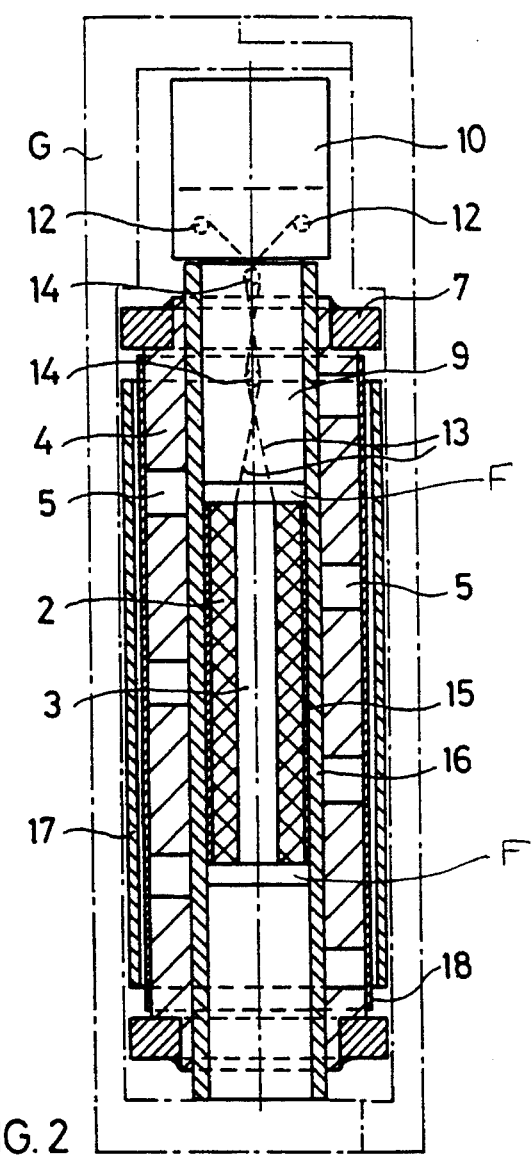
FIG. 2 shows a section along the line II—II in FIG. 1.
Figure 4:
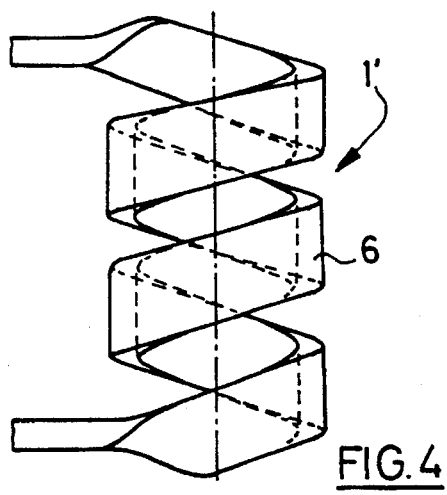
FIG. 4 shows a first exemplary variant of the primary conductor of the measuring transformer.
Figure 3:
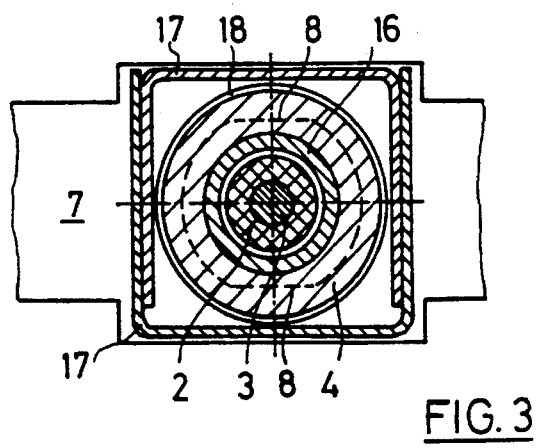
FIG. 3 shows a section along the line III—III in FIG. 1.

According to FIGS. 1—3, which are drawn to a scale of approximately 3:1, a measuring transformer according to the invention comprises essentially a primary conductor 1 and a secondary coil 2 which is surrounded by said primary conductor and is supported by a coil former 3. The primary conductor 1 is formed by a copper tube 4 into which a helical groove 5 is milled so that, in terms of its function, the primary conductor corresponds to a helically wound strip whose pitch per revolution is greater than the width of the strip. FIG. 4 shows an alternative embodiment of a primary conductor 1' which is formed by a copper strip 6 which is wound in the same manner.

The copper tube 4 is soldered at each of its ends into a flat copper profile 7 which is used as a busbar to feed current to be measured to or to discharge it from the copper tube 4. As can be seen in FIGS. 1 and 3, the copper tube 4 has two flats 8 on its ends which are soldered to the flat profiles 7, which flats 8, together with corresponding forming like a keyhole of a hole in the flat profile 7 which is provided for retention of the copper tube 4, are used to prevent rotation during soldering.

Together with the two busbars 7, the tubular primary conductor 1 forms an extraordinarily stable component which can hold the entire transformer measuring arrangement together without additional holding means being required. The said component is provided for installation in a flat box-shaped measuring module, as is described in EP-A-0 494 427, the disclosure of which is hereby incorporated by reference in its entirety. The housing G of this measuring module is drawn in dash-dotted lines in FIG. 2.

The coil former 3 of the cylindrical secondary coil 2 consists of a cylindrical core and two end flanges F and F'. Connected to the first of these two end flanges F, to be precise to the upper one in FIGS. 1 and 2, there is a first cylindrical part 9 which has the same diameter as the end flanges, and connected thereto is a second cylindrical part 10 of larger diameter. The first cylindrical part 9 and a region of the second cylindrical part 10 connected thereto are web-shaped (i.e., flattened on one side to form a stem, or rib, preferably to the level of the coil former 3), so that a stem 11 extends from the coil former 3 into the second cylindrical part 10. The stem 11 is best illustrated in FIG. 1 as including a flat edge on the right hand side of part 10 which extends from the lower half of part 10 along part 9 and down to cylindrical flange F.

The coil former 3 and the two cylindrical parts 9 and 10 (with stem 11) are produced integrally, preferably injectionmoulded (e.g., of plastic), and form one component. The second cylindrical part 10 having the larger diameter forms a quasi-handle for handling this component and is used as the stop which fixes the axial position of the secondary coil 2 in the copper tube 4.

Two plug-like contact elements 12 for the connection of the secondary coil 2 to evaluation electronics (not shown) are arranged on the part of the stem 11 which is arranged on the second cylindrical part 10 and projects outward from the copper tube 4. The two ends of the winding wire 13 of the secondary coil 2 are guided axially outward from the coil former 3 to the contact elements 12, which is already done on the winding machine which produces the secondary coil 2.

Studs 14 for guiding the winding wire 13 are provided on the stem 11 between the contact elements 12 and the coil former 3. The input line and output line of the winding wire 13 are laid by the winding in opposite directions around the studs 14, as a result of which the antenna surface which is spanned by the connections of the secondary coil 2 is minimized. In this way, the costly twisting of the connecting ends of the winding wire 13, which is otherwise normal, can be omitted. The stem 11 could also be used as a support for the evaluation electronics which in this case would be positioned optimally, to be precise as close as possible to the location of origin of the measured signal.

In order to reduce the capacitive coupling between the primary conductor 1 and the secondary coil 2, a screening winding 15 or foil is provided between the primary conductor 1 and secondary coil, which screening winding or foil has both of its ends connected to one side (i.e., one end) of the secondary coil 2.

As can furthermore be seen in FIGS. 1 to 3, electrical insulation 16 is provided between the primary conductor 1 and the secondary conductor 2, which electrical insulation does not need to satisfy any special strength requirements, as a result of the already-mentioned inherent stability of the arrangement. According to the drawing, the insulation 16 is of hose-shaped or tubular construction and, in length, overhangs the primary conductor 1 whose axial length is approximately twice as great as that of the secondary coil 2. Polybutylene terephthalate or polycarbonate is preferably used as the material for the insulation 16, the thickness of the insulation 16, which must have a specific surge strength, being approximately 0.6 millimeters.

The measuring transformer is screened against external magnetic fields by magnetic screening 17 which surrounds the copper tube 4 on the outside and is insulated from the copper tube 4 by a film-like insulation layer 18. The screening 17 is formed either by two interleaved U-profiles of soft-magnetic material, preferably µ-metal (e.g., ferromagnetic material such as iron, nickel, cobalt or some of their alloys) wherein µ is the magnetic permeability of the material, or by a soft-magnetic, self adhesive foil which is wound around the insulation layer 18, it being possible for saturation problems to occur in the case of this foil. Polyester is preferably used as the material for the insulation layer 18.

This type of magnetic screening has the advantage that it can be applied to the completely installed measuring transformer and thus has no adverse effect on its installations. A variant would be for a single-layer or multi-layer tube to be wound from thermomagnetic sheet metal and to be pushed over the copper tube 4 supporting the insulation layer 18, which, however, would have to be carried out before soldering the copper tube 4 to the flat profiles 7.

The described measuring transformer is distinguished by robustness and high inherent stability and is simple in construction and installation. The construction of the primary conductor as a copper tube having a milled-in groove of helical shape additionally permits simple optimization of the primary conductor to the maximum current intensity to be measured, by corresponding matching of the pitch of the groove. In addition, the homogeneity of the field within the measuring transformer can be influenced by variation of the groove pitch over the tube length.

Figure 7:
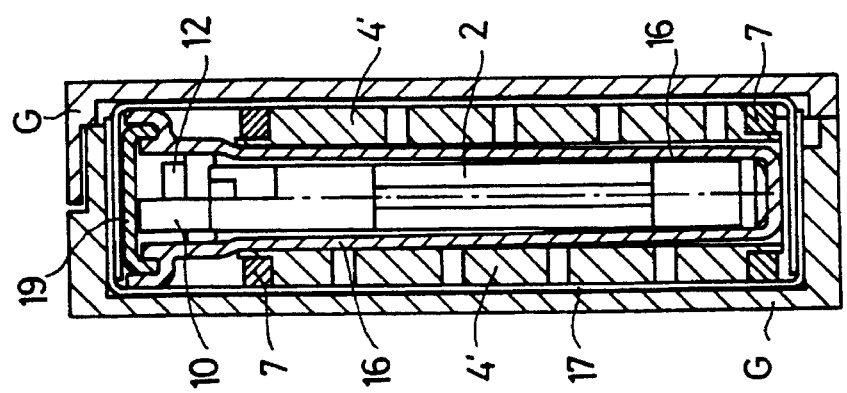
FIG. 7 shows a section through a measuring module of an electricity meter furnished with the primary conductor of FIG. 5.
Figure 5:
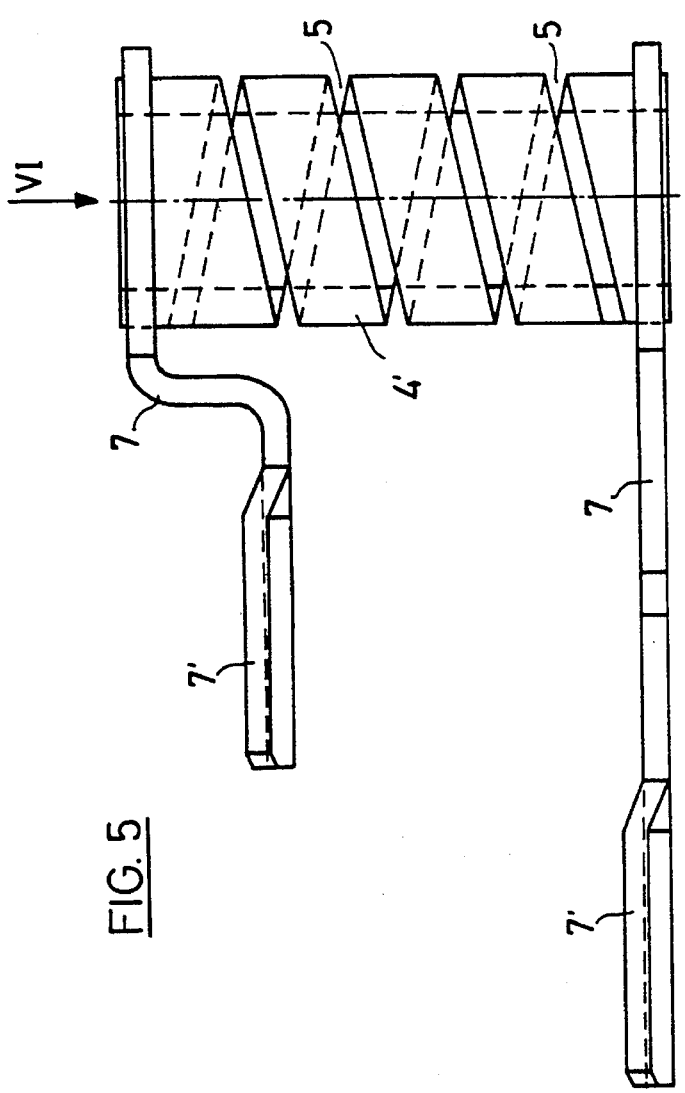
FIG. 5 shows a second exemplary variant of the primary conductor.
Figure 6:
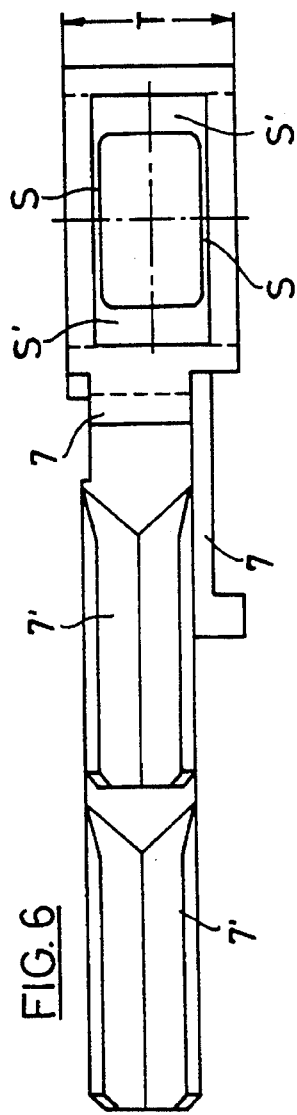
FIG. 6 shows a view in the direction of the arrow VI in FIG. 5.

According to the exemplary embodiment shown in FIGS. 5–7, the primary conductor 1 is not formed by a tube with a circular cross-section but by a hollow section 4' with a rectangular cross-section. Obviously, the secondary coil 2 has a corresponding rectangular cross-section. As the width of the housing G which can be used for the installation of the measuring transformer is given, the corresponding dimension of the primary conductor is also given. This dimension is, in the case of the circular tube 4 its external diameter, in the case of the rectangle hollow section 4' the narrower dimension T of this section. As a circle has a smaller cross-section than a rectangle circumscribing this circle, the length of the wire being wound on the secondary coil 2 with the rectangular cross-section is larger than the length of a wire wound on the circular secondary coil. This means that a defined current in the primary conductor induces in the rectangular secondary coil a larger signal than in the circular coil.

Besides to this advantage with regard to the measuring technique, the measuring transformer shown in FIGS. 5–7 has the further advantage that the helical groove 5 can be manufactured much simpler than in the case of the circular tube 4. When this groove has four turns as shown in FIG. 5, there are to be milled four grooves in every wall of the hollow section 4'. This can be achieved very simply with the aid of four spaced side mill cutters milling simultaneously the four grooves into one of the longer side walls S whereby the depth of the milling corresponds to the half of the dimension T of the smaller side walls S'. After a rotation of the hollow section 4' of 180° around its axis, likewise four grooves are milled in a second operation into the other longer side walls S and into the second half of the shorter side walls S'. After termination of this second operation, the desired groove with four turns is formed.

From FIGS. 5 and 6, it can be seen that the flat profiles 7 comprise a through-shaped end section 7' which is part of the connecting terminal for the respective connecting wire (see also EP-A-O 494 427 already mentioned in this specification).

FIG. 7 shows a variant of the insulation 16 arranged between the primary conductor 1 and the secondary coil 2. According to the representation, the insulation 16 is formed as a quiver enclosing the measuring transformer. At the lower end in FIG. 7, the quiver forming the insulation 16 is furnished with a bottom and at the upper end there is provided a cantilever with a recess in which a cover 19 can be fixed. This variant has the advantage of an optimum protection of the secondary coil 2.

It will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

What is claimed is:

1. Apparatus for measuring electricity, comprising:
   a primary conductor having a helical body for carrying current to be measured, said helical body being shaped to define an interior and having a helical groove;
   a secondary coil which is inserted into the interior of said primary conductor such that said helical body surrounds the secondary coil with at least one turn to magnetically couple said primary conductor and said secondary coil; and
   a winding provided between said primary conductor and said secondary coil for reducing capacitive coupling between said primary conductor and said secondary coil.

2. Apparatus according to claim 1, wherein said helical body is formed by a solid tube having a helical groove which passes through its wall.

3. Apparatus according to claim 2, wherein the solid tube is conductively connected at its ends to busbars which are used to feed and discharge the current.

4. Apparatus according to claim 3, wherein the busbars are formed with a strip-like profile, and wherein ends of the solid tube are inserted into holes in the busbars and soldered thereto.

5. Apparatus according to claim 1, wherein said helical body is formed by a strip which is bent into a helical shape.

6. Apparatus according to claim 5, wherein the secondary coil includes a winding former onto which, in an axial direction, a protrusion is formed which over,hangs sides of the helical body.

7. Apparatus according to claim 6, wherein said protrusion is cylindrical and includes a stop for positioning the secondary coil and the protrusion in an axial direction inside the primary conductor.

8. Apparatus according to claim 7, wherein the cylindrical protrusion is of web-shaped construction and is provided with a flattened portion, said apparatus further including:
   plug-shaped connections arranged on the flattened portion for contacting ends of the second coil.

9. Apparatus according to claim 8, further including:
   studs arranged on the flattened portion for guiding the ends of a winding wire which run from the second coil to the plug-shaped connections, the ends of said winding wire being wrapped around the studs in opposing directions.

10. Apparatus according to claim 6, further comprising:
    a tubular insulation between the primary conductor and the secondary coil.

11. Apparatus according to claim 6, further comprising:
    magnetic screening which surrounds the primary conductor and consists of soft-magnetic material.

12. Apparatus according to claim 11, wherein said magnetic screening is formed with parts having U-shaped sheet-metal profiles, said U-shaped sheet-metal profiles engaging one another in an interleaved manner.

13. Apparatus according to claim 11, further comprising:
    a film-like insulation between the primary conductor and the magnetic screening.

14. Apparatus according to claim 1, wherein the helical body of the primary conductor is formed by a hollow section with rectangular cross-section, and wherein the secondary coil also has a rectangular cross-section.

15. Apparatus according to claim 10, wherein the insulation is quiver shaped, said quiver-shaped insulation being closable with a cover for enclosing the secondary coil and the protrusion formed onto the winding former.

16. Apparatus according to claim 14, wherein the secondary coil includes a winding former onto which, in an axial direction, a protrusion is formed which overhangs sides of the helical body.

17. Apparatus according to claim 16, further comprising:
    a tubular insulation between the primary conductor and the secondary coil.

18. Apparatus according to claim 17, wherein the insulation is quiver shaped, said quiver-shaped insulation being closable with a cover for enclosing the secondary coil and the protrusion formed onto the winding former.

19. Apparatus according to claim 6, further comprising:
    magnetic screening which surrounds the primary conductor and consists of μ-metal.

20. Apparatus according to claim 1, wherein said winding further includes:
    first and second ends connected to one end of said secondary coil.

21. Apparatus according to claim 20, wherein said secondary coil is inserted into said primary conductor and held by the primary conductor.

22. Apparatus according to claim 1, wherein said secondary coil is formed about a coil former, said coil former being plastic.

23. Apparatus for measuring electricity, comprising:
    a primary conductor having a helical body for carrying current to be measured;
    a secondary coil which is inserted into an interior of said primary conductor such that said helical body surrounds the secondary coil with at least one turn to magnetically couple said primary conductor and said secondary coil, said secondary coil including a winding former onto which, in an axial direction, a cylindrical protrusion is formed which overhangs sides of the helical body, said cylindrical protrusion having a flattened portion;
    contact elements arranged on the flattened portion for contacting at least one end of the secondary coil; and
    studs arranged on the flattened portion for guiding ends of a winding wire from the secondary coil to the contact elements, a first end of said winding wire being wrapped around a first stud in a first direction and a second end of said winding wire being wrapped around a second stud in a second opposing direction.

* * * * *